United States Patent
Marsh et al.

(10) Patent No.: US 7,282,408 B2
(45) Date of Patent: *Oct. 16, 2007

(54) SURFACE TREATMENT OF AN OXIDE LAYER TO ENHANCE ADHESION OF A RUTHENIUM METAL LAYER

(75) Inventors: Eugene P. Marsh, Boise, ID (US); Brenda D. Kraus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/848,985

(22) Filed: May 18, 2004

(65) Prior Publication Data

US 2004/0214354 A1  Oct. 28, 2004

Related U.S. Application Data

(63) Continuation of application No. 10/418,411, filed on Apr. 16, 2003, now Pat. No. 6,737,313.

(51) Int. Cl.
*H01L 21/8242* (2006.01)

(52) U.S. Cl. .................. 438/253; 438/240; 438/396

(58) Field of Classification Search ........ 438/253–256, 438/393–399, 3, 240
See application file for complete search history.

(56) References Cited

U.S. PATENT DOCUMENTS

| | | | |
|---|---|---|---|
| 5,436,200 A | 7/1995 | Tanaka | 438/654 |
| 5,861,677 A | 1/1999 | You et al. | 257/783 |
| 5,962,716 A | 10/1999 | Uhlenbrock et al. | 556/16 |
| 5,990,559 A | 11/1999 | Marsh | 257/768 |
| 6,053,791 A * | 4/2000 | Fujii et al. | 445/6 |
| 6,114,557 A | 9/2000 | Uhlenbrock et al. | 556/21 |
| 6,187,622 B1 * | 2/2001 | Kuroiwa et al. | 438/240 |
| 6,197,628 B1 | 3/2001 | Vaartstra et al. | 438/238 |
| 6,204,172 B1 | 3/2001 | Marsh | 438/653 |
| 6,218,297 B1 | 4/2001 | Marsh | 438/654 |
| 6,281,161 B1 | 8/2001 | Marsh | 502/339 |
| 6,284,655 B1 | 9/2001 | Marsh | 438/681 |
| 6,323,511 B1 | 11/2001 | Marsh | 257/295 |
| 6,403,414 B2 | 6/2002 | Marsh | 438/239 |
| 6,421,223 B2 | 7/2002 | Marsh | 361/306.3 |
| 6,461,909 B1 | 10/2002 | Marsh et al. | 438/238 |
| 6,462,367 B2 | 10/2002 | Marsh et al. | 257/295 |
| 6,495,458 B2 | 12/2002 | Marsh | 438/681 |
| 6,521,772 B1 | 2/2003 | Lienhard et al. | 556/136 |
| 6,541,067 B1 | 4/2003 | Marsh et al. | 427/252 |
| 6,737,313 B1 * | 5/2004 | Marsh et al. | 438/240 |
| 2001/0012659 A1 * | 8/2001 | Sashida et al. | 438/250 |
| 2003/0164469 A1 * | 9/2003 | Yoshida et al. | 252/70 |
| 2004/0053290 A1 * | 3/2004 | Terbrueggen et al. | 435/6 |

OTHER PUBLICATIONS

Power Chemical Corp., product information at www.powerchemical.net/coupling.htm; date unknown, printed Apr. 2006.

Mitsubishi International Corp., product information at www.micchem.com/products/SilaneCouplingAgents.htm; date unknown, printed Apr. 2006.

Semiconfareast, technical information at www.semiconfareast.com/polysilicon-deposition.htm; date unknown, printed Apr. 2006.

* cited by examiner

*Primary Examiner*—H. Jey Tsai

(57) ABSTRACT

A method for forming a ruthenium metal layer on a dielectric layer comprises forming a silicon dioxide layer, then treating the silicon dioxide with a silicon-containing gas, for example silicon hydrides such as silane, disilane, or methylated silanes. Subsequently, a ruthenium metal layer is formed on the treated dielectric layer. Treating the dielectric layer with a silicon-containing gas enhances adhesion between the dielectric and the ruthenium without requiring the addition of a separate adhesion layer between the dielectric layer and the ruthenium metal layer.

20 Claims, 5 Drawing Sheets

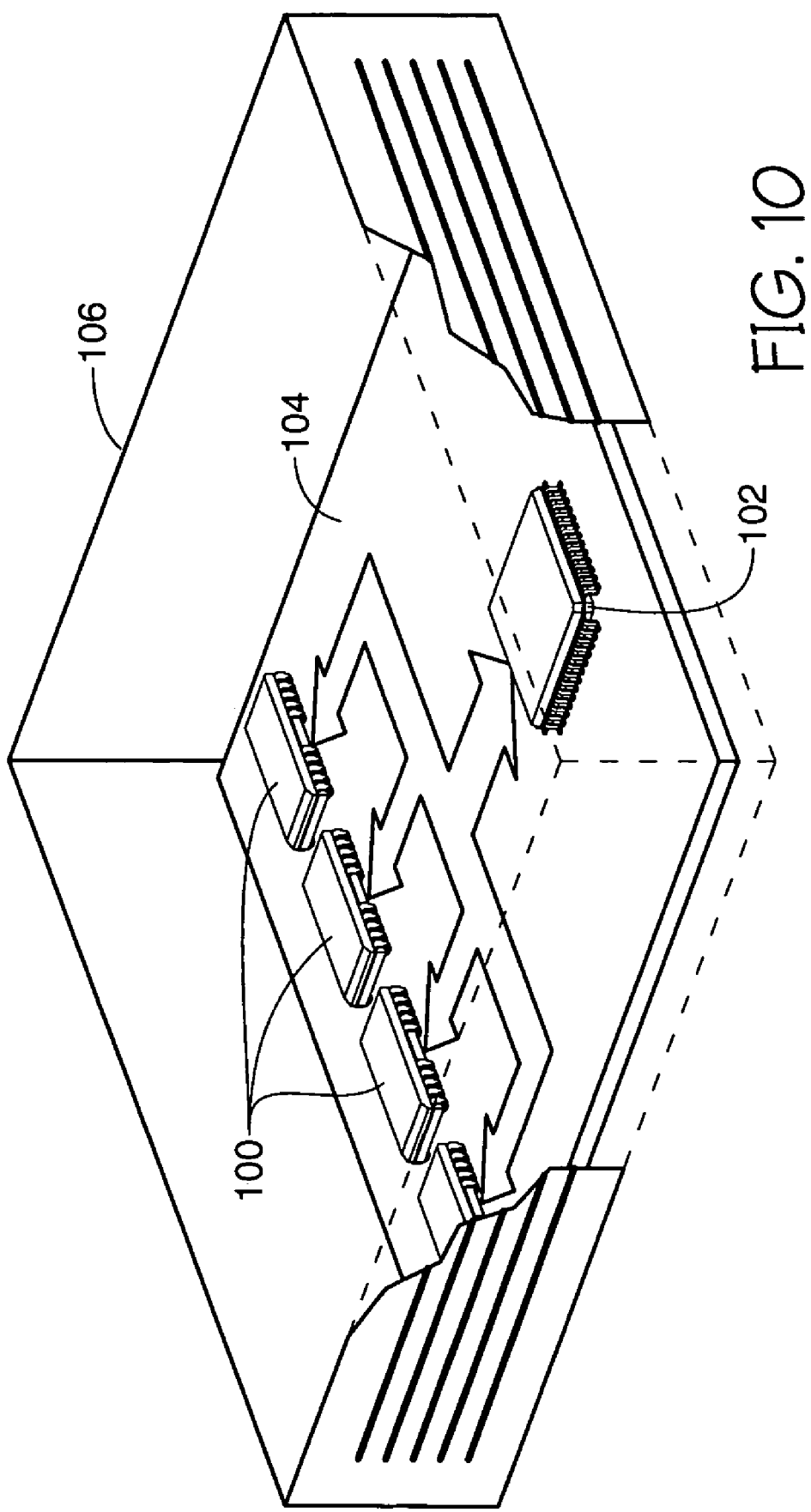

SURFACE TREATMENT OF AN OXIDE LAYER TO ENHANCE ADHESION OF A RUTHENIUM METAL LAYER

This is a continuation of U.S. application Ser. No. 10/418,411 filed Apr. 16, 2003 and issued May 18, 2004 as U.S. Pat. No. 6,737,313.

FIELD OF THE INVENTION

This invention relates to the field of semiconductor manufacture and, more particularly, to the formation of a ruthenium metal layer during the formation of a semiconductor device.

BACKGROUND OF THE INVENTION

During the manufacture of semiconductor devices such as dynamic random access memories (DRAMs), microprocessors, and logic devices, several conductive structures are commonly formed. For example, transistor gates and capacitor bottom (storage) and top plates, typically manufactured from doped polysilicon, and interconnects and runners, typically formed from aluminum and/or copper, are formed on various types of devices.

A design goal of semiconductor engineers is to decrease feature sizes while maintaining adequate conductivity of interconnects and sufficient capacitance within storage capacitors. With increasing device density, polysilicon becomes less desirable as a material to form conductive structures such as storage capacitors and other conductive features. A conductive material which has been used for various semiconductor device structures such as capacitor plates in ferroelectrics devices is ruthenium oxide ($RuO_2$). Ruthenium oxide exhibits good step coverage and a uniform thickness across various topographies. However, $RuO_2$ is not stable and disproportionates into a strong oxidizer. It will, over time, oxidize various metal layers which are in close proximity. For example, if $RuO_2$ is used as a capacitor bottom plate, it will oxidize a titanium nitride or tungsten nitride top plate through a tantalum pentoxide ($Ta_2O_5$) capacitor dielectric. Further, a barrier layer must be formed to protect a polysilicon contact pad from the $RuO_2$, as the $RuO_2$ will oxidize the polysilicon and result in a bottom plate being electrically isolated from the contact pad by a silicon dioxide layer.

Attempts have also been made to use ruthenium metal as capacitor plates or as various other structures, as ruthenium metal is stable and is easily planarized during chemical mechanical polishing (CMP). However, previous methods for forming a ruthenium metal layer, for example using chemical vapor deposition (CVD), result in a layer which has poor adhesion to an underlying silicon dioxide layer.

Various layers have been proposed to enhance the adhesion of a metal layer to a dielectric. The following US patents, each having at least one inventor in common with the present application and assigned to Micron Technology, Inc., are each incorporated herein as if set forth in its entirety. Each patent describes the use of adhesion layers: U.S. Pat. Nos. 5,990,559; 6,197,628; 6,204,172; 6,218,297; 6,281,161; 6,284,655; 6,323,511; 6,403,414; 6,421,223; 6,461,909; 6,462,367; 6,495,458. In particular, U.S. Pat. No. 6,462,367 discloses in one embodiment an adhesion layer for adhering ruthenium to a dielectric, the adhesion layer comprising $RuSi_xO_y$, where "x" and "y" are in the range of about 0.01 to about 10, with a thickness of between about 10 angstroms (Å) to about 1,000 Å.

While an adhesion layer is often desired or required to ensure a device does not malfunction as a result of a layer (such as ruthenium metal) peeling from an underlying layer (such as a silicon dioxide dielectric), the functionality of some completed structures is enhanced if the distance between two layers is minimized. Thus, the inclusion of an extra layer, the adhesion layer, between two such layers can be detrimental. Further, adding additional layers to a complicated process can introduce additional variation which may result in decreased device performance or predictability of device functionality.

A method for forming a ruthenium metal layer on a dielectric layer which reduces or eliminates the problems described above, and the structure resulting from the method, would be desirable.

SUMMARY OF THE INVENTION

The present invention provides a new method which, among other advantages, reduces problems associated with the manufacture of semiconductor devices, particularly problems resulting from the failure of a ruthenium metal layer to adhere to a dielectric layer, and problems resulting from thickness and electrical variations introduced by an adhesion layer. In accordance with one embodiment of the invention, a dielectric layer is formed, then etched if necessary to form a desired supporting dielectric feature. Subsequently, the exposed surface of the dielectric layer is treated by exposure to silane ($SiH_4$). After this treatment, a ruthenium metal layer is formed, for example using chemical vapor deposition. Treating the dielectric layer with silane prior to forming the ruthenium metal layer has been found to provide enhanced adhesion between the ruthenium metal layer and the dielectric layer without adding an additional adhesion layer between the dielectric and ruthenium layers.

While treating silicon dioxide with silane may be preferred, it is also possible to treat the silicon dioxide with other chemicals, such as other silicon-containing gasses. For example, silicon hydrides (compounds of the general formula $Si_nH_{2n+2}$) other than silane, such as disilane gas ($Si_2H_6$) or methylated silanes, may function sufficiently to alter the surface termination of the silicon dioxide. As described in the Detailed Description of the Preferred Embodiment, it is also possible to treat oxides other than silicon dioxide.

Additional advantages will become apparent to those skilled in the art from the following detailed description read in conjunction with the appended claims and the drawings attached hereto.

BRIEF DESCRIPTION OF THE DRAWINGS

FIG. 10 is a representation depicting a possible use of the invention.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
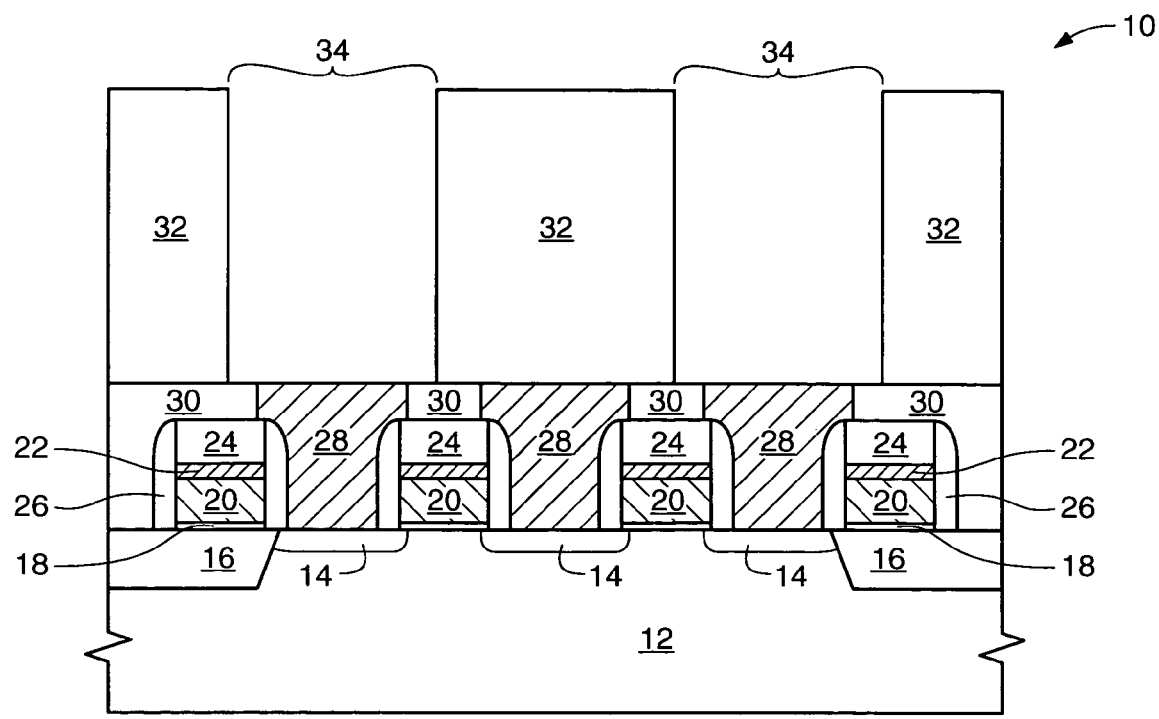
FIGS. 1-4 are cross sections depicting an inventive process to form a plurality of storage capacitors during the formation of a semiconductor device.

A first exemplary use of an inventive method which forms a storage capacitor bottom plate for a semiconductor memory device such as a dynamic random access memory (DRAM) is depicted in FIGS. 1-4. FIG. 1 depicts a semiconductor wafer substrate assembly 10 comprising a semiconductor wafer 12 having doped source/drain regions 14 therein. FIG. 1 further comprises field oxide 16 and a plurality of transistors with each transistor comprising gate oxide 18 formed on the wafer 12, a polysilicon control gate layer 20 formed over the gate oxide, and a tungsten silicide layer 22 formed on the polysilicon control gate layer 20 which enhances conductivity of the completed control gate. Each transistor further comprises a nitride capping layer 24 and nitride spacers 26. Polysilicon contact pads 28 formed between the transistors contact the doped regions 14, and an interpad dielectric 30 electrically separates each contact pad 28. FIG. 1 also comprises a patterned silicon dioxide layer 32 formed over the transistors and the contact pads. The silicon dioxide layer 32 comprises openings 34 therein which expose the contact pads 28. This structure is easily manufactured by one of ordinary skill in the art. The silicon dioxide layer may be formed with any process, for example using tetraethyl orthosilicate (TEOS) vapor or by forming a borophosphosilicate glass (BPSG) layer.

A wafer assembly such as the structure of FIG. 1 is placed into a chemical vapor deposition (CVD) chamber, for example a plasma-enhanced CVD chamber such as an Applied Materials Centura or a TEL Unity, and then exposed to silane gas ($SiH_4$). In one exemplary implementation, silane is flowed into the chamber at a rate of between about 1 standard cubic centimeters per minute (sccm) and about 100 sccm, more particularly between about 5 sccm and about 20 sccm, for example 5 sccm, while the wafer temperature is maintained at between about 150° C. and about 350° C., more specifically between about 200° C. and about 250° C., and most particularly about 230° C. This process is maintained for a duration of between about 10 seconds and about 120 seconds. Further, during the introduction of silane into the chamber, pressure within the chamber is controlled to between about 1 Torr and about 5 Torr, for example about 3 Torr.

Treating the surface of the silicon dioxide with silane has been found to enhance the adhesion between the silicon dioxide dielectric and a ruthenium metal layer formed on the dielectric without adding additional thickness. While the mechanism for this has not been studied and is not essential to the invention, it is believed that the silane changes the surface termination of the silicon dioxide, possibly by changing a hydroxyl-terminated surface of the dielectric to a hydrogen-terminated surface which forms a more secure bond with the ruthenium metal layer. Treating the exposed polysilicon contact pads 28 is not believed to significantly affect the conductivity of the polysilicon or the adhesion of the polysilicon to the ruthenium metal layer. It may be possible to treat oxides other than silicon dioxide, for example metal oxides and mixed metal oxides such as hafnium oxide ($HfO_2$), aluminum oxide ($Al_2O_3$), tantalum pentoxide ($Ta_2O_5$), barium strontium titanate ($Ba_xSr_{1-x}TiO_3$, or "BST"), titanium oxide ($TiO_2$), yttrium aluminum oxide ($Y_xAl_yO_z$), and aluminum hafnium oxide ($Al_xHf_yO_z$).

It should be noted that while treating the oxide with silane may be preferred, it is also possible to treat the oxide with other chemicals, such as other silicon-containing gasses, to achieve improved bonding of the ruthenium metal layer to the dielectric. For example, silicon hydrides (compounds of the general formula $Si_nH_{2n+2}$) other than silane, such as disilane gas ($Si_2H_6$) or methylated silanes, may function sufficiently to enhance adhesion between the dielectric and the ruthenium metal.

Figure 2:
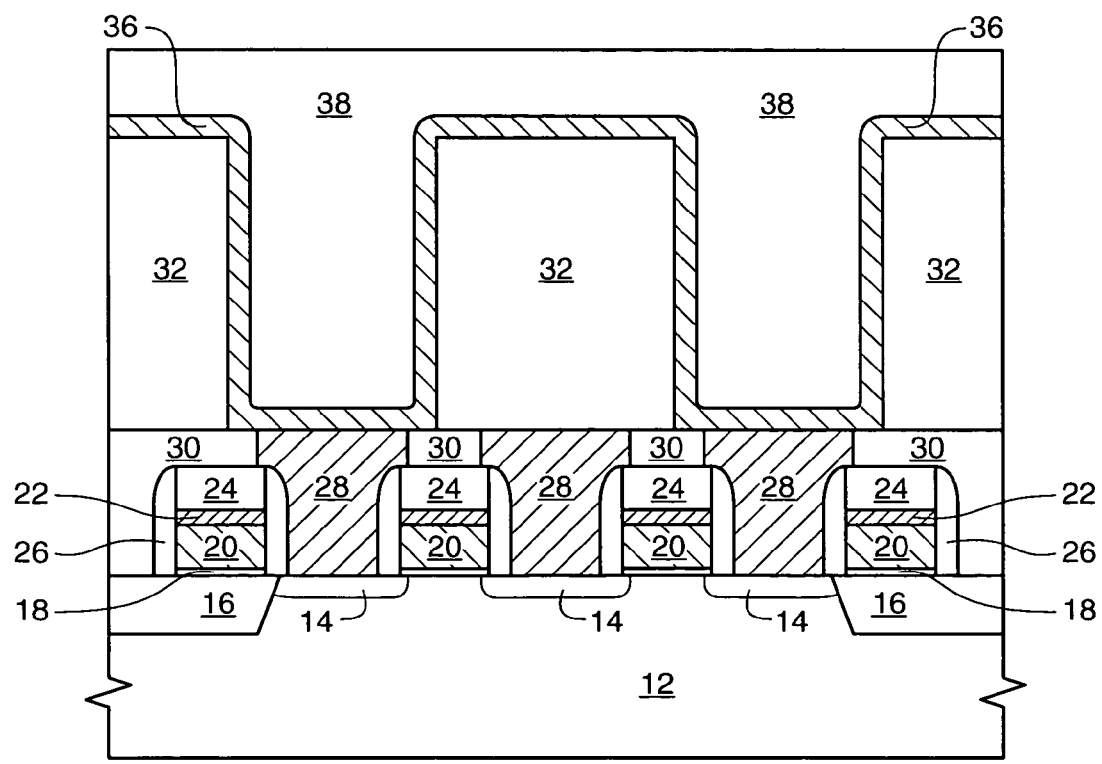

After treating the dielectric surface with silane (or another silicon-containing gas), a ruthenium metal layer 36 is formed as depicted in FIG. 2. The conformal ruthenium metal layer is, preferably, formed in situ within the CVD chamber described above, such as by flowing a helium carrier at a rate of between about 0 sccm and about 1,000 sccm, more particularly between about 50 sccm and about 200 sccm, for example 50 sccm through a ruthenium precursor introduced into the chamber. Suitable ruthenium precursors include: tricarbonyl cyclohexadiene ruthenium, chemical formula $(C_6H_8)Ru(CO)_3$; bis(cyclopentadienyl) ruthenium, also known as "ruthenocene," chemical formula $(C_5H_5)_2Ru$; and derivatives of ruthenocene having a melting point less than that of ruthenocene, which is about 194° C. to about 198° C., such as bis(ethylcyclopentadienyl) ruthenium. Tricarbonyl cyclohexadiene ruthenium is discussed in U.S. Pat. Nos. 5,962,716 and 6,114,557 to Uhlenbrock et al. which are assigned to Micron Technology, Inc. and incorporated herein by reference as if set forth in their entirety. Flowing the helium and ruthenium precursor continues for a duration of between about 30 seconds and about 8 minutes, or until a ruthenium metal layer between about 50 angstroms (Å) and about 200 Å is formed. During the formation of the ruthenium metal layer, the wafer is maintained at a temperature of between about 100° C. and about 500° C., and the chamber is maintained at a pressure of between about 1 Torr and about 5 Torr, for example about 3 Torr. This process forms a ruthenium metal layer at a rate of between about 1 Å/second and about 50 Å/second, depending on the settings used during the formation process.

An alternate process to the CVD process described above for forming a ruthenium metal layer includes atomic layer deposition (ALD) of the ruthenium metal layer in a deposition chamber using a pulse process. In this process, the ruthenium precursor is pulsed for between about 0.1 milliseconds (ms) and about 10 seconds, and more particularly for between about 2 seconds and about 5 seconds. During the flow of the ruthenium precursor a reducing gas such as hydrogen ($H_2$) or carbon monoxide (CO) may also be flowed to assure dissociation of the precursor. After flowing the precursor and, if used, the reducing gas, the precursor is purged from the chamber, for between about 1 second and about 60 seconds. The purge step can comprise the use of an inert gas such as argon, nitrogen, or helium. After purging the chamber, the precursor and, if used, the reducing gas is again pulsed, then the purge is again performed. This process can be performed at a temperature of between about 275° C. and about 400° C., and at a pressure of about $10^{-5}$ Torr. During the pulse, the pressure will increase to about 2 Torr. Ruthenium metal will form at a rate of about 1 Å during each cycle, so for a bottom plate between about 10 Å and about 300 Å thick, the process is performed for between about 10 and about 300 cycles. For a bottom plate between about 100 Å and about 200 Å, the process is performed for between about 100 and 200 cycles.

Subsequent to treating the oxide with silane, it is preferable that formation of the subsequent ruthenium metal layer occur with minimal temporal delay. For example, the metal layer should, preferably, be formed within about 60 minutes after treating the $SiO_2$ layer, and more preferably within about 10 minutes. As the metal layer may be formed in situ within the CVD chamber, this may be easily accomplished. A delay in processing beyond about 10 minutes will decrease the effectiveness of the treatment, and the decrease becomes more severe after a delay of longer than about one hour. It is currently theorized that this decrease in effectiveness may be a result of the hydrogen-terminated surface reacting with environmental oxygen to reform a hydroxyl-terminated surface.

Figure 3:
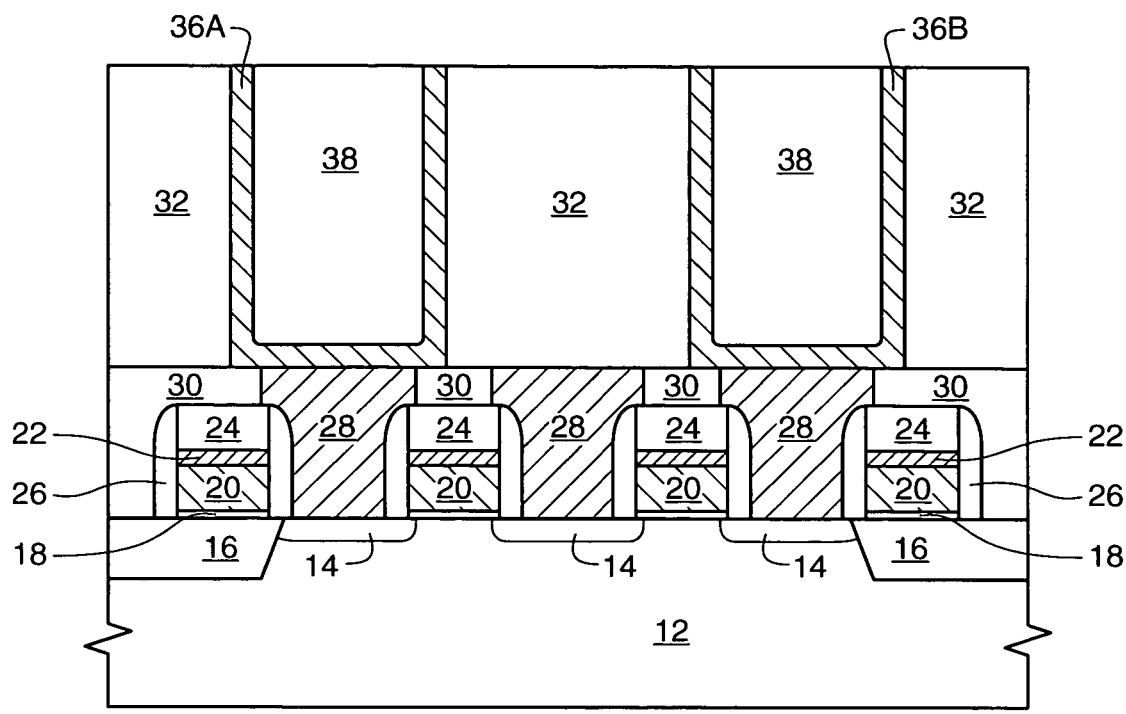
Figure 4:
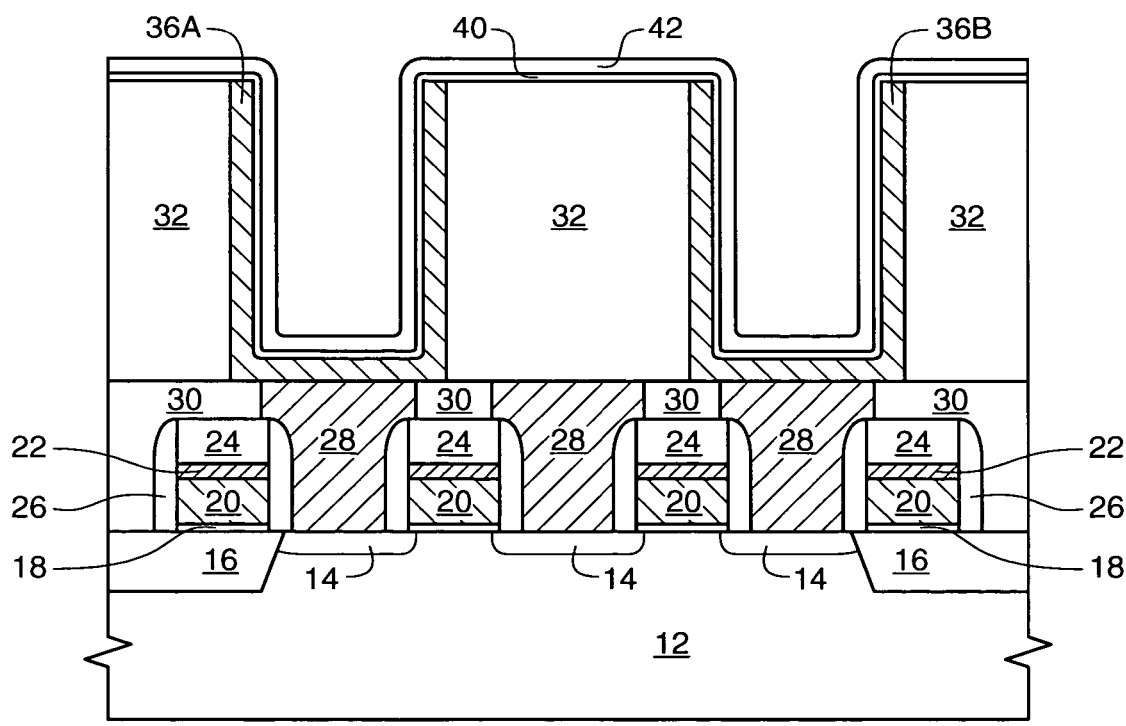

After forming the ruthenium metal layer 36, a protective layer 38 is formed within the openings in the dielectric 32 and over the ruthenium 36 within the openings. The protective layer 38, for example photoresist, may also be formed over the entire surface of the dielectric 32 as depicted in FIG. 2. In this embodiment, the structure of FIG. 2 is planarized, for example using mechanical polishing or chemical mechanical polishing (CMP) to remove the photoresist and ruthenium metal from the upper horizontal surface of the oxide 32 as depicted in FIG. 3. This planarization defines individual capacitor bottom plates 36A, 36B. Subsequently, the protective layer 38 is removed and a capacitor cell dielectric layer 40 between about 15 Å thick and about 100 Å thick is formed over the surface of the ruthenium metal as depicted in FIG. 4. Any cell dielectric comprising an oxide may be used, but preferred materials include $HfO_2$, $Al_2O_3$, $Ta_2O_5$, and BST. Next, a capacitor top plate layer 42, for example a ruthenium, platinum, or titanium nitride layer between about 10 Å and about 300 Å thick, and more particularly between about 100 Å and about 200 Å, is formed. The FIG. 4 structure can be manufactured by one of ordinary skill in the art from the information herein. Wafer processing continues according to means known in the art to form a semiconductor device comprising capacitor storage plates 36A, 36B, capacitor cell dielectric 40, and capacitor top plate 42 as depicted in FIG. 4.

Figure 5:
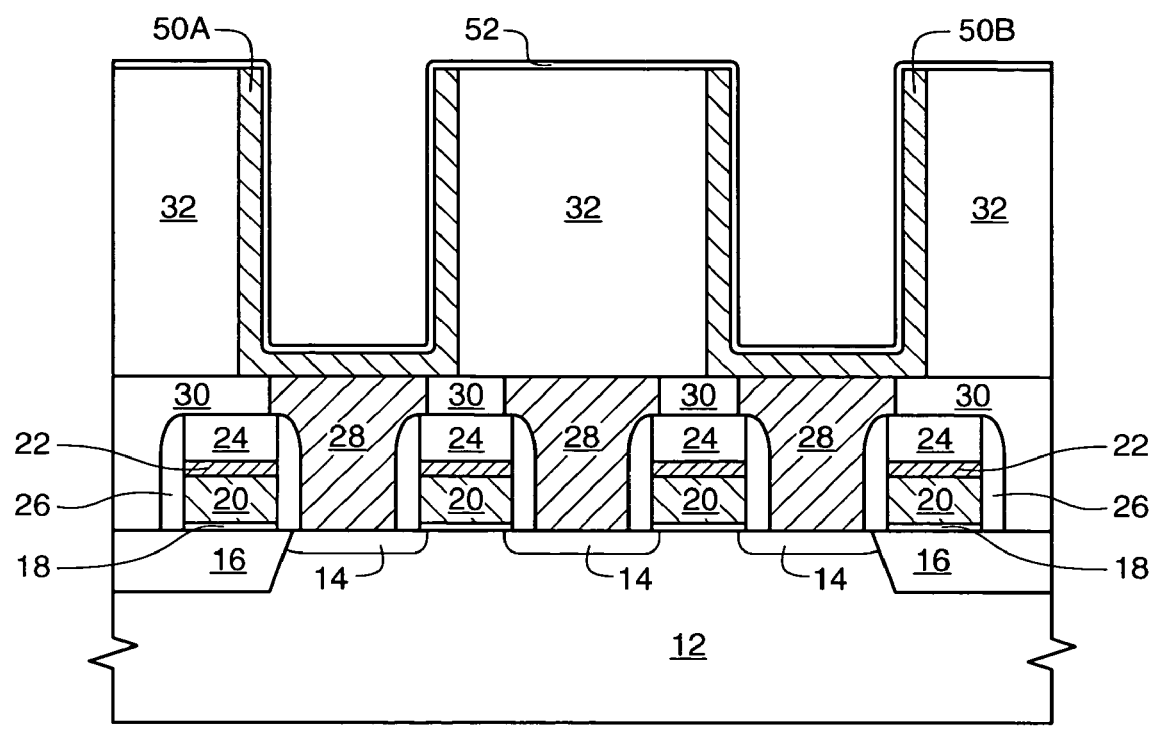
FIGS. 5-6 are cross sections depicting an inventive process to form a capacitor top plate during the formation of a semiconductor device.
Figure 6:
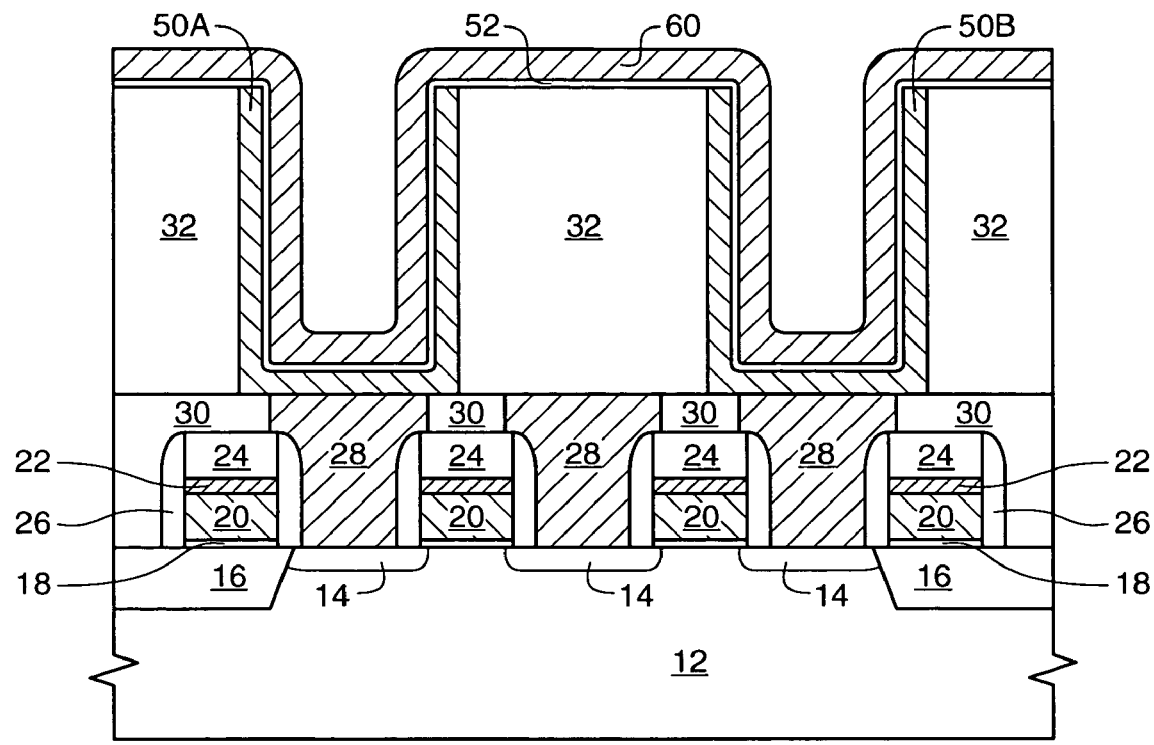

A second exemplary use of an inventive method which treats a capacitor dielectric with silane then forms a storage capacitor top plate from ruthenium metal during the formation of a semiconductor device is depicted in FIGS. 5-6. As ruthenium metal has less than desirable step coverage, this embodiment may be somewhat less optimal than the first embodiment. In this embodiment, a semiconductor wafer substrate assembly such as that depicted in FIG. 5 is formed. The FIG. 5 structure comprises the structures of FIG. 1, and further includes a capacitor bottom plates 50A, 50B and a capacitor cell dielectric 52. The bottom plate can be formed from ruthenium as described for the first embodiment above, or may comprise smooth polysilicon or hemispherical silicon grain (HSG) polysilicon. In any case, the cell dielectric 52 is treated with silane ($SiH_4$) or one of the other gasses described above, using a process similar to that described above to treat oxide layer 32 of FIG. 1. As with the first embodiment, treating the cell dielectric is believed to change the surface termination of the dielectric, possibly by changing the hydroxyl-terminated surface to a hydrogen-terminated surface which forms a more secure bond with the ruthenium metal layer.

Subsequent to treating the FIG. 5 structure with silane, a layer of ruthenium 60 is formed on cell dielectric 52 as depicted in FIG. 6. As a ruthenium top plate layer is about the same thickness as a ruthenium bottom plate, the top plate is formed using one of the processes described above for the previous embodiment, or a similar workable process, to form a ruthenium metal layer for the present embodiment of between about 10 Å and about 300 Å thick, and more particularly between about 100 Å and about 200 Å. Subsequent to forming the FIG. 6 structure, wafer processing continues according to means known in the art to form a semiconductor device, such as a semiconductor memory device.

Figure 7:
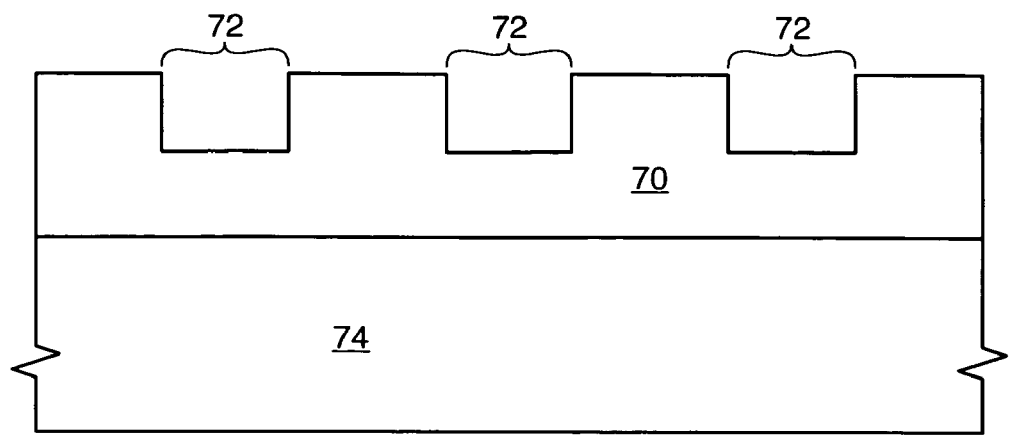
FIGS. 7-9 are cross sections depicting an inventive process to form a plurality of damascene interconnects.
Figure 8:
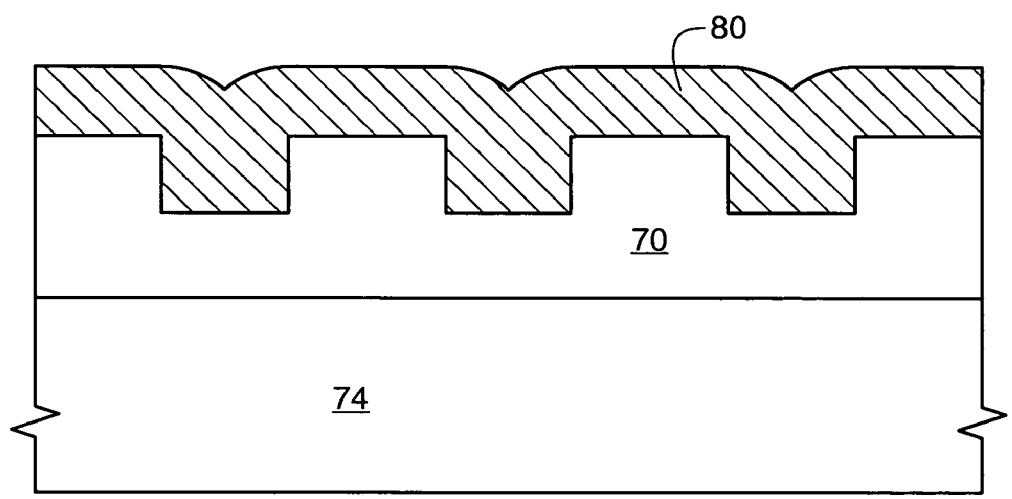
Figure 9:
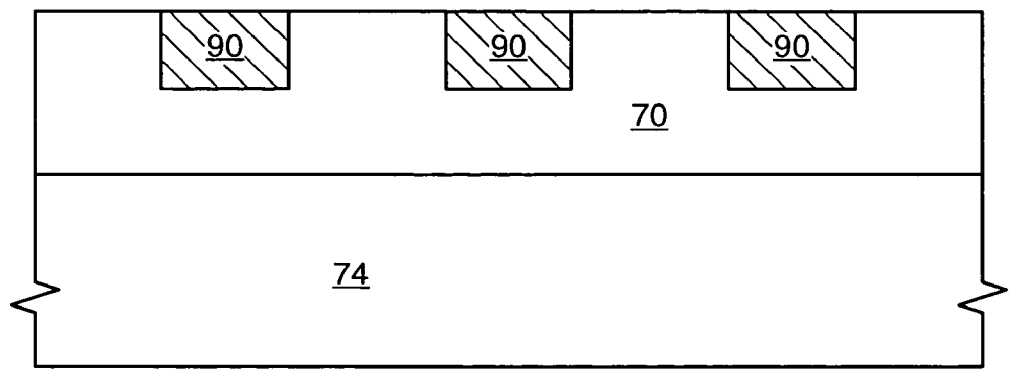

FIGS. 7-9 depict a third embodiment of the invention, which forms a plurality of damascene interconnects or other damascene features. As known in the art, damascene features are formed by providing a recess in a dielectric layer, overfilling the recess with a conductor, and planarizing the conductor and possibly a portion of the dielectric to result in the conductor filling only the recess. The recess may include an opening in the dielectric which exposes an underlying conductor, or a recess as described with reference to FIGS. 7-9 which extends only partially into the dielectric.

In the embodiment of FIGS. 7-9, an oxide dielectric layer 70 having one or more recesses 72 therein is formed over a semiconductor wafer assembly 74. The recesses 72 can be formed by providing a patterned photoresist over a planarized dielectric layer, then partially etching through the dielectric layer to form recesses 72 as depicted in the dielectric. It is likely the structure of FIG. 7 as depicted will comprise additional features which, for simplicity, are not depicted, such as doped regions within wafer 74, conductive pads and plugs which contact doped regions within wafer 74, transistors, etc. Subsequent to forming the patterned oxide layer 70, the surface of the dielectric is treated, for example using an oxide treatment process as described above for the first and second embodiments.

After forming the FIG. 7 structure and treating oxide 70 with a silicon-containing gas, a ruthenium metal layer 80 is formed as depicted in FIG. 8. To fill the recesses 72, the thickness of the ruthenium metal layer must be at least half as thick as the width of the recesses 72. After forming the ruthenium metal layer 80, the ruthenium is removed from the upper surface of dielectric 70 to result in the FIG. 9 structure comprising conductive damascene interconnects 90. As depicted in FIG. 9, an upper surface of each conductive interconnect 90 is continuous with an upper surface of the oxide 70. The ruthenium can be removed using a mechanical polishing process, for example a chemical mechanical polishing (CMP) process known in the art.

As depicted in FIG. 10, a semiconductor device 100 formed in accordance with the invention may be attached along with other devices such as a microprocessor 102 to a printed circuit board 104, for example to a computer motherboard or as a part of a memory module used in a personal computer, a minicomputer, or a mainframe 106. FIG. 10 may also represent use of device 100 in other electronic devices comprising a housing 106, for example devices comprising a microprocessor 102, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention other than the capacitor plates depicted and described herein, will be apparent to persons skilled in the art upon reference to this description. For example, other conductive lines and interconnects and other ruthenium metal structures formed on a dielectric layer will be apparent to one of ordinary skill in the art from the description herein. It is therefore contemplated that the appended claims will cover any such modifications or embodiments as fall within the true scope of the invention.

Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

What is claimed is:

1. A method for forming a semiconductor device, comprising:
   providing an oxide layer as part of a semiconductor wafer substrate assembly;
   placing the semiconductor wafer substrate assembly into a deposition chamber;
   flowing a silicon-containing gas selected from the group consisting of $SiH_4$, $Si_2H_6$, and methylated silanes into the deposition chamber for a duration of between about 0.1 milliseconds and about 10 seconds to expose the oxide layer to the silicon-containing gas;
   subsequent to exposing the oxide layer to the silicon-containing gas, flowing a ruthenium metal precursor into the deposition chamber to form a ruthenium metal layer on the oxide layer;
   purging the ruthenium metal precursor from the chamber for between about 1 second and about 60 seconds; then
   repeating the flow of the ruthenium metal precursor into the deposition chamber and the purging of the ruthenium metal precursor from the chamber a sufficient number of times to form the ruthenium metal layer of a sufficient thickness.

2. The method of claim 1 wherein the flowing of the ruthenium metal precursor into the deposition chamber comprises flowing a gas selected from the group consisting of tricarbonyl cyclohexadiene ruthenium, bis(cyclopentadienyl) ruthenium, and a derivative of ruthenocene.

3. The method of claim 1 further comprising flowing helium into the deposition chamber concurrently during the flowing of the ruthenium metal precursor into the deposition chamber.

4. The method of claim 1 wherein the oxide layer is silicon dioxide.

5. The method of claim 1 wherein the oxide layer comprises an oxide selected from the group consisting of metal oxide and mixed metal oxide.

6. The method of claim 1 wherein the oxide layer comprises an oxide selected from the group consisting of hafnium oxide, aluminum oxide, tantalum pentoxide, barium strontium titanate, titanium oxide, yttrium aluminum oxide, and aluminum hafnium oxide.

7. The method of claim 1 further comprising maintaining a thickness of the oxide layer such that subsequent to the exposure of the oxide layer to the silicon-containing gas the oxide layer is not thicker than prior to the exposure to the silicon-containing gas, and the exposure to the silicon-containing gas does not form a separate layer of material on the oxide layer.

8. The method of claim 1 further comprising forming the ruthenium metal layer 60 minutes or less after exposing the oxide layer to the silicon-containing gas.

9. The method of claim 1 further comprising forming the ruthenium metal layer 10 minutes or less after exposing the oxide layer to the silicon-containing gas.

10. The method of claim 1 further comprising performing the flow of the ruthenium metal precursor into the deposition chamber and the purge of the ruthenium metal precursor from the chamber for between about 10 cycles and about 300 cycles.

11. A method used to form a storage capacitor for a semiconductor device, comprising:
    providing a semiconductor wafer substrate assembly comprising a conductive contact pad and a planarized oxide layer over the conductive contact pad;
    etching the oxide layer to expose the conductive contact pad;
    in a deposition chamber, flowing a silicon-containing gas selected from the group consisting of $SiH_4$, $Si_2H_6$, and methylated silanes at a flow rate of between about 1 standard cubic centimeter per minute (sccm) and about 100 sccm for a duration of between about 10 seconds and about 120 seconds while maintaining the semiconductor wafer substrate assembly at a temperature of between about 150° C. and about 350° C. to expose the oxide layer to the silicon-containing gas, wherein the exposure of the oxide layer to the silicon-containing is conducted in an environment such that the exposure to the silicon-containing gas does not add additional thickness to the oxide layer; and
    subsequent to exposing the oxide layer to the silicon-containing gas, flowing a ruthenium metal precursor into the deposition chamber to form a ruthenium metal layer on the oxide layer and on the conductive contact pad.

12. The method of claim 11 wherein the flowing of the ruthenium metal precursor into the deposition chamber comprises flowing a gas selected from the group consisting of tricarbonyl cyclohexadiene ruthenium, bis(cyclopentadienyl) ruthenium, and a derivative of ruthenocene.

13. The method of claim 11 wherein the flowing of the ruthenium metal precursor into the deposition chamber comprises flowing a gas selected from the group consisting essentially of tricarbonyl cyclohexadiene ruthenium, bis(cyclopentadienyl) ruthenium, and derivatives of ruthenocene.

14. The method of claim 11 further comprising forming a ruthenium metal layer between about 50 angstroms (Å) and about 200 Å during the flow of the ruthenium metal precursor into the deposition chamber.

15. The method of claim 14 further comprising:
    flowing the ruthenium metal precursor into the deposition chamber at a flow rate of between about 0 standard cubic centimeters per minute (sccm) and about 1,000 sccm;
    maintaining the semiconductor wafer substrate assembly at a temperature of between about 100° C. and about 500° C. during the flow of the ruthenium metal precursor into the deposition chamber;
    maintaining the deposition chamber at a pressure of between about 1 Torr and about 5 Torr during the flow of the ruthenium metal precursor into the deposition chamber; and
    flowing the ruthenium metal precursor into the deposition chamber for a duration of between about 30 seconds and about 8 minutes.

16. The method of claim 1 wherein the ruthenium metal layer is formed after exposing the oxide layer to the silicon-containing gas.

17. The method of claim 11 wherein the ruthenium metal layer is formed after exposing the oxide layer to the silicon-containing gas.

18. A method used to form a storage capacitor for a semiconductor device, comprising:
    providing a semiconductor wafer substrate assembly comprising a conductive contact pad and a planarized oxide layer over the conductive contact pad;

etching the oxide layer to expose the conductive contact pad;

in a deposition chamber, flowing a silicon-containing gas to expose the oxide layer to the silicon-containing gas, wherein the exposure of the oxide layer to the silicon-containing is conducted in an environment such that the exposure to the silicon-containing gas does not add additional thickness to the oxide layer; and subsequent to exposing the oxide layer to the silicon-containing gas, flowing a ruthenium metal precursor into the deposition chamber for a duration of between about 30 seconds and about 8 minutes at a flow rate of between about 0 standard cubic centimeters per minute (sccm) and about 1,000 sccm while maintaining the semiconductor wafer substrate assembly at a temperature of between about 100° C. and about 500° C. and a pressure of between about 1 Torr and about 5 Torr to form a ruthenium metal layer between about 50 angstroms (Å) and about 200 Å on the oxide layer and on the conductive contact pad.

19. The method of claim 18 wherein the flowing of the ruthenium metal precursor into the deposition chamber comprises flowing a gas selected from the group consisting of tricarbonyl cyclohexadiene ruthenium, bis(cyclopentadienyl) ruthenium, and a derivative of ruthenocene.

20. The method of claim 18 wherein the flowing of the ruthenium metal precursor into the deposition chamber comprises flowing a gas selected from the group consisting essentially of tricarbonyl cyclohexadiene ruthenium, bis (cyclopentadienyl) ruthenium, and derivatives of ruthenocene.

* * * * *

UNITED STATES PATENT AND TRADEMARK OFFICE
CERTIFICATE OF CORRECTION

| | |
|---|---|
| PATENT NO. | : 7,282,408 B2 |
| APPLICATION NO. | : 10/848985 |
| DATED | : October 16, 2007 |
| INVENTOR(S) | : Marsh et al. |

It is certified that error appears in the above-identified patent and that said Letters Patent is hereby corrected as shown below:

On the face page, in field (56), under "U.S. Patent Documents", in column 1, line 2, below "5,436,200 A  7/1995   Tanaka      438/654"
insert -- 5,604,158   2/1997   Cadien et al.  438/645--.

Signed and Sealed this

Twenty-fifth Day of December, 2007

JON W. DUDAS
*Director of the United States Patent and Trademark Office*